United States Patent [19]

Matsumoto et al.

[11] Patent Number: 4,903,610
[45] Date of Patent: Feb. 27, 1990

[54] RAILWAY CARRIER APPARATUS FOR SEMICONDUCTOR WAFERS

[75] Inventors: Takashi Matsumoto; Shigeru Tanaka; Tsutomu Shinya, all of Ise; Yoshiyuki Iwasawa, Tokyo; Tsutomu Ishida, Tokyo; Hiroshi Harada, Tokyo; Shintaro Kobayashi, Tokyo; Kenji Okamoto, Tokyo, all of Japan

[73] Assignees: Shinko Electric Co., Ltd.; Shimizu Construction Co., Ltd., both of Tokyo, Japan

[21] Appl. No.: 126,475

[22] Filed: Nov. 25, 1987

[30] Foreign Application Priority Data

Nov. 26, 1986 [JP] Japan ............................ 61-181531[U]
Feb. 18, 1987 [JP] Japan ................................ 62-34842

[51] Int. Cl.⁴ ............................................ B65G 43/00
[52] U.S. Cl. ................................... 104/118; 104/119; 104/96; 104/88
[58] Field of Search ................... 104/96, 88, 102, 103, 104/130, 195, 118, 119, 120, 130, 139; 296/3, 181, 182; 280/79.6, 79.7; 180/89.1, 89.2

[56] References Cited

U.S. PATENT DOCUMENTS

| | | | |
|---|---|---|---|
| 2,710,221 | 6/1955 | Hinners | 296/181 |
| 4,007,533 | 2/1977 | Brandon et al. | 104/96 |
| 4,279,201 | 7/1981 | Solomon | 104/96 |
| 4,336,757 | 6/1982 | Toder | 104/96 |
| 4,451,079 | 5/1984 | Takahashi | 180/89.13 |

Primary Examiner—Richard A. Bertsch
Attorney, Agent, or Firm—Scully, Scott, Murphy & Presser

[57] ABSTRACT

A railway carrier apparatus for semiconductor wafers which are contained in a wafer cassette is disclosed. This railway carrier apparatus includes: a carrier for carrying the wafer cassette; a guide rail, disposed along a line of travel of the carrier, for supporting the carrier to guide the carrier along the line of travel; and a drive mechanism for driving the carrier along the line of travel. The carrier includes; a carrier body slidably connected to the guide rail for movement along the guide rail; and a bedplate member, mounted on the carrier body, for supporting the wafer cassette on its upper face. The upper face of the bedplate member is inclined with respect to a horizontal plane in such a manner that one of its opposite side edges is positioned at a higher level than the other side edge.

15 Claims, 10 Drawing Sheets

RAILWAY CARRIER APPARATUS FOR SEMICONDUCTOR WAFERS

BACKGROUND OF THE INVENTION

This invention relates to a railway carrier apparatus for transporting semiconductor wafers which is contained in a wafer cassette.

In semiconductor producing plants, there are widely used railway carriers for transporting semiconductor wafers contained in wafer cassettes. These railway carriers generally utilize linear motors in order to enhance the cleanliness level of the clean rooms in the product plants.

Figure 1:
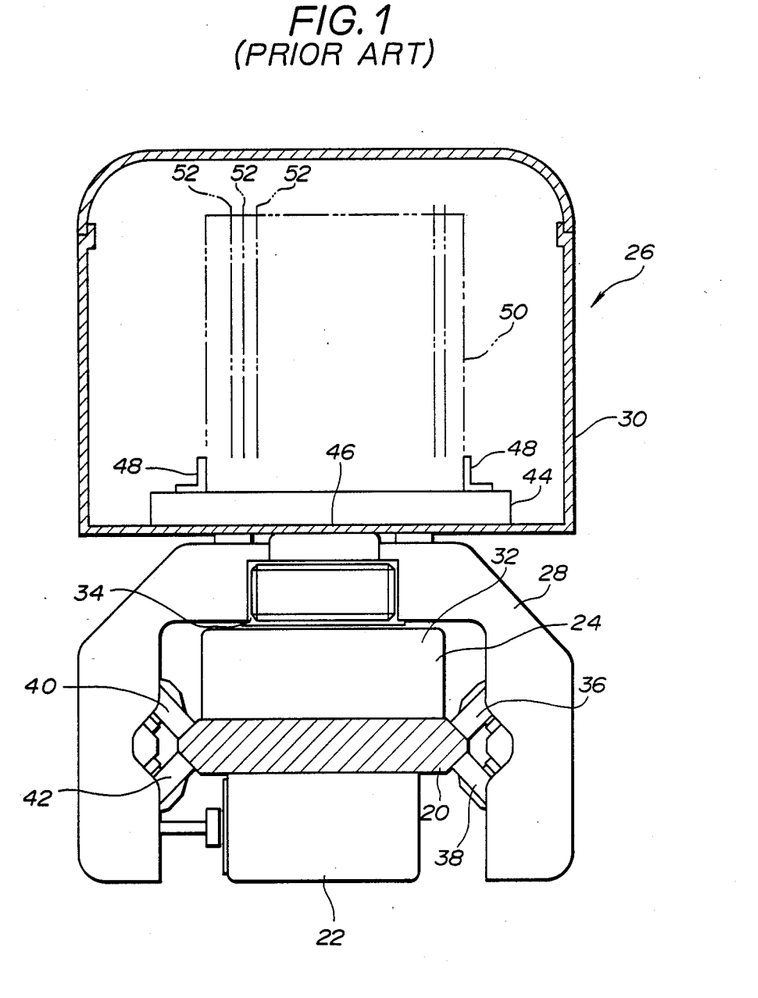
FIG. 1 is a front view, partly in section, of a conventional railway carrier apparatus.

FIG. 1 illustrates a typical example of the conventional railway carrier. Reference numeral 20 denotes a substantially flat guide rail which is supported by support bases 22. This guide rail 20 is provided on its upper face with a plurality of primary units 24 aligned at predetermined longitudinal distances. These primary units 24 constitute a linear motor 32 in cooperation with a secondary unit described later on, and produce magnetic fields for driving a carrier 26 along the guide rail 20. The carrier 26 has a carrier body 28 designed to straddle the guide rail 20, and also has a container 30 mounted on the carrier body 28 so as to contain a wafer cassette 50 in it. The secondary unit 34 of the linear motor 32 is attached to the inner face of the carrier body 28 so that the secondary unit 34 confronts the primary unit 24 on the guide rail 20. A plurality of wheels 36, 38, 40 and 42 are rotatably connected to the inner face of the carrier body 28, and are engaged with side faces of the guide rail 20 so that the carrier body 28 is movable along the guide rail 20. On the bottom wall 46 of the container 30, there is secured a flat bedplate 44 having engaging members 48 which are adapted to engage with the corners of a wafer cassette 50 so that the cassette 50 is stably placed on the bedplate 44.

Figure 2:
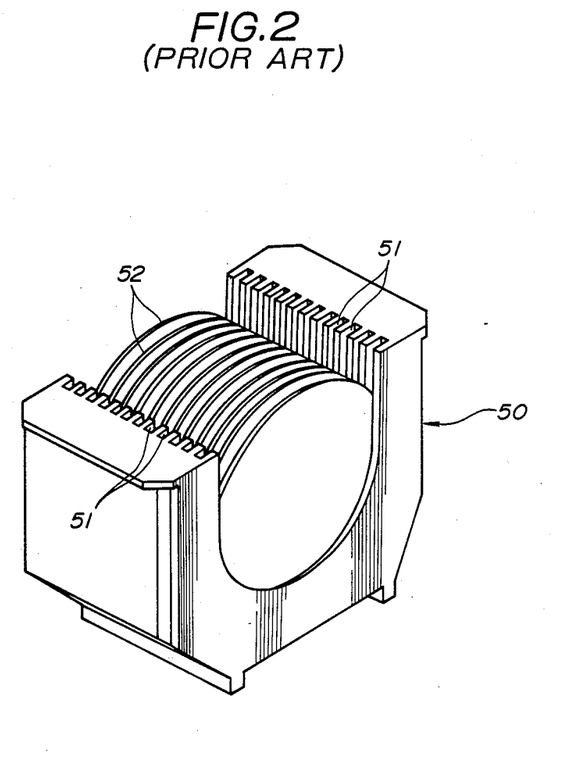
FIG. 2 is a perspective view of a wafer cassette in which a couple of semiconductor wafers are contained.

As illustrated in FIG. 2, the wafer cassette 50 is a channel-shaped structure having an open top face, U-shaped opposite end faces, a closed bottom face and a curved inner face. A plurality of parallel grooves 51 are formed in the curved inner face of the cassette 50. In order to transport semiconductor wafers 52 by the carrier 26, the semiconductor wafers 52 are put into the cassette 50 in such a manner that the semiconductor wafers 52 are received in the grooves 51 of the cassette 50 and thus are parallel both to one another and to the U-shaped end faces. Then the cassette 50 is placed in the container 30 so that the semiconductor wafers 52 are aligned vertical and parallel to the longitudinal direction of the guide rail 20.

However, since the width of each cassette's groove is generally larger than the thickness of a semiconductor wafer 52, the wafers 52 are rocked due to inertia force or due to vibration transferred from the carrier 26, during the transference of the carrier 26, for example, upon the starting, the braking and the cornering of the carrier 26. As a result, the wafers 52 are rubbed against the inner wall of the grooves of the cassette 50, which causes such damage as abrasion of the semiconductor wafers 52.

SUMMARY OF THE INVENTION

Accordingly, it is an object of the present invention to provide a railway carrier apparatus which is capable of transporting the semiconductor wafers without giving damage to the wafers, particularly to their front surfaces.

Another object of the present invention is to provide a railway carrier apparatus which does not contaminate the workroom in which it is installed.

With these and other objects in view, the present invention provides a railway carrier apparatus including: a carrier for carrying the wafer cassette; a guide rail, disposed along a line of travel of the carrier, for supporting the carrier to guide the carrier along the line of travel; and drive means for driving the carrier along the line of travel. The carrier comprises; a carrier body slidably connected to the guide rail for movement along the guide rail; and a bedplate member, mounted on the carrier body, for supporting the wafer cassette on its upper face. The upper face of the bedplate member has one and the other side edges and is inclined with respect to a horizontal plane in such a manner that the one side edge of the upper face is positioned at a higher level than the other side edge. It is preferred that the upper face of the bedplate member is inclined at an angle larger than 0° and not larger than 40°. In order to transport semiconductor wafers by this railway carrier apparatus, a wafer cassette containing the semiconductor wafers is placed on the bedplate so that the wafers are inclined to a vertical plane and thereby the rear surfaces of all the wafers lean against the inner walls of the grooves of the wafer cassette. In this condition, the semiconductor wafers are stably settled in the cassette and the front faces of the wafers are spaced from the inner wall of the grooves. Accordingly, the front faces of the semiconductor wafers are not damaged by being rubbed against the inner faces of the grooves of the cassette even though the carrier is vibrated during the transference of the carrier.

The carrier may have an engaging member, attached to that portion of the bedplate member adjacent to the other edge of the upper face of the bedplate member, for engaging with the wafer cassette so that the cassette is prevented from slipping down the upper face of the bedplate member.

The carrier may have suspension means, interposed between the carrier body and the bedplate member, for dampening the vibration transferred from the carrier body to the bedplate member so that the semiconductor wafers in the wafer cassette on the bedplate are subjected to less vibration than the carrier body. It is preferred that the suspension means comprises a plurality of vertical damper members such as vertically elastic, first tubular bellows. The suspension means may also include: a support frame member fixedly connected to the carrier body and projecting upward; a connecting frame member fixedly connected to the bedplate member and projecting downward so as to confront with the support frame member; and a plurality of horizontal damper members such as horizontally elastic, second tubular bellows extending between the support and connecting frame members.

Each of the vertical damper members may have a coil spring coaxially encased in the first tubular bellows. Each of the horizontal damper members may also have a coil spring coaxially encased in the second tubular bellows.

Furthermore, the suspension means may include: first air vent means for allowing air to go in and out of the first tubular bellows; and first filter means for filtrating air going out of the first tubular bellows through the first air vent means. Also, the suspension means may include: second air vent means for allowing air to go in and out of the second tubular bellows; and second filter means for filtrating air going out of the second tubular bellows through the second air vent means.

The railway apparatus may have a station assembly for shifting the carrier in a horizontal direction perpendicular to the line of travel. The station assembly includes: a track disposed under an incontinuous section of the guide rail and extending perpendicular to the guide rail; a shifting tray member slidably connected to the track for movement along the track; and a guide rail piece carried by the shifting tray member, the guide rail piece bridging the incontinuous section of the guide rail when the shifting tray member is in its initial position.

DETAILED DESCRIPTION OF THE PREFERRED EMBODIMENTS

In FIGS. 3 to 13, parts shown in FIGS. 1 and 2 are designated by like reference numerals and thus descriptions thereof are omitted.

Figure 3:
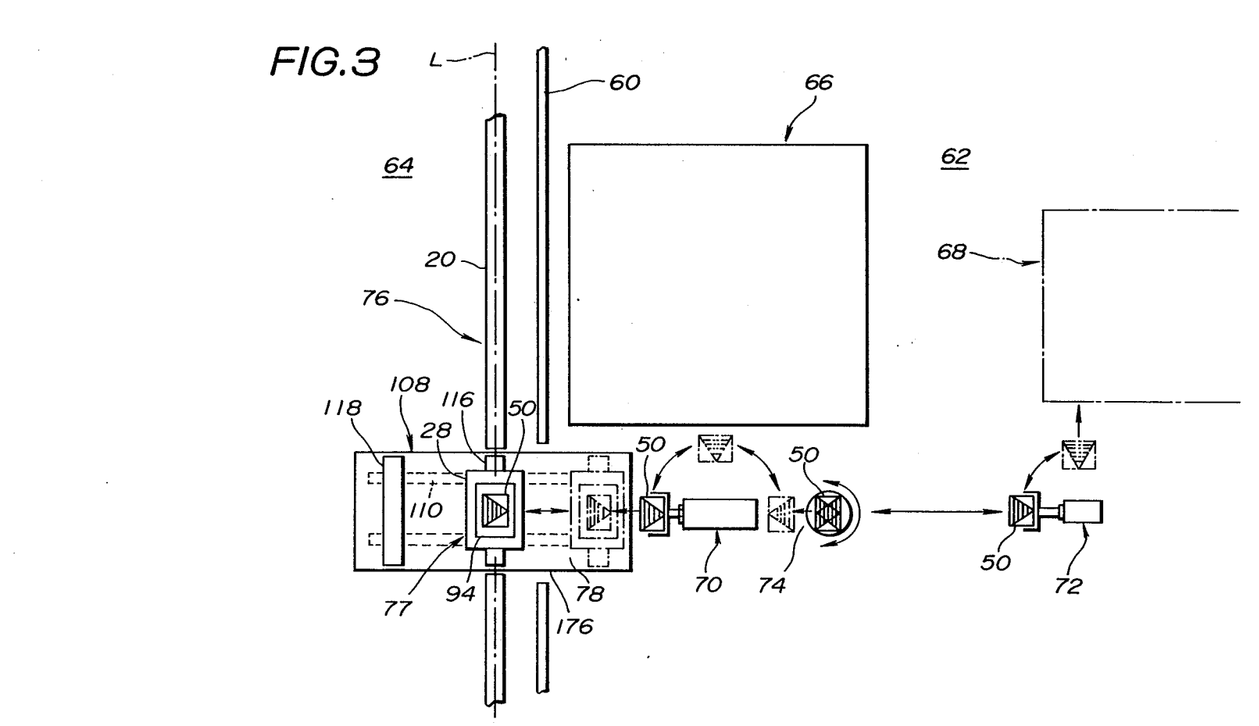
FIG. 3 is a schematic plan view of a clean room in which a railway carrier apparatus according to the present invention is installed.

FIG. 3 illustrates a clean room in which a railway carrier apparatus according to the present invention is installed. The clean room is divided by a partition wall 60 into a work area 62 and a passage area 64. In the passage area 64, the railway carrier apparatus 76 is installed, while in the work area 62, there are installed a wafer storage cabinet 66, semiconductor processing apparatus 68, wafer-transporting robots 70 and 72 and a turntable apparatus 74. An opening 78 is formed in the partition wall 60 to serve as a gateway for allowing wafer cassettes to go in and out of the work area 62 therethrough.

Figure 4:
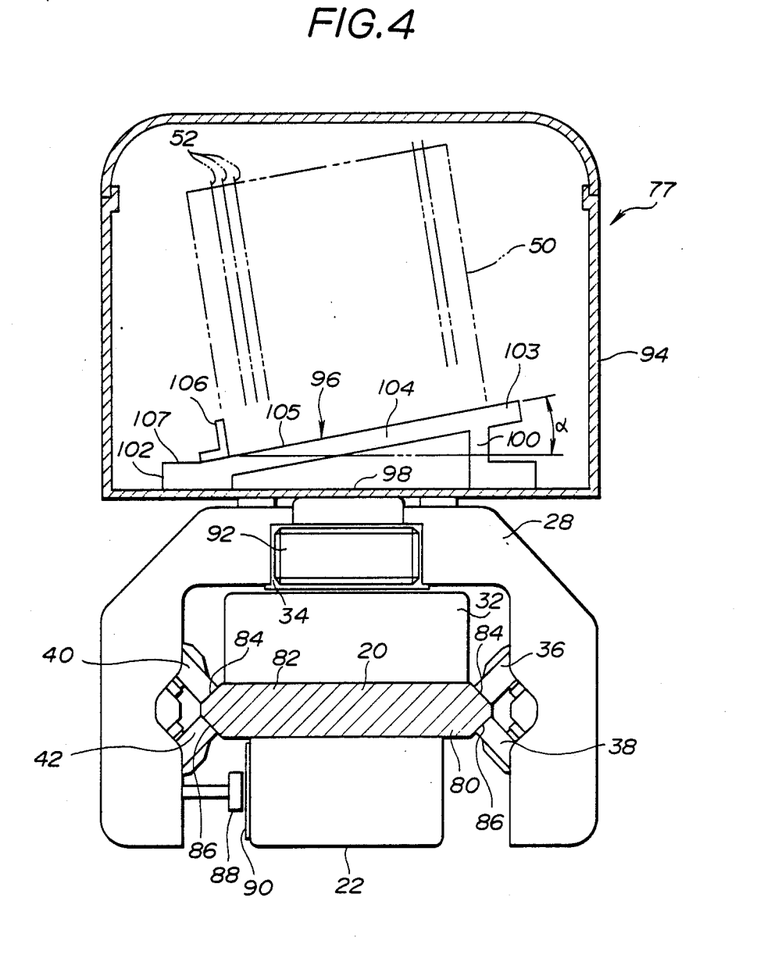
FIG. 4 is a front view, partly in section, of the railway carrier apparatus in FIG. 3.

The railway carrier apparatus 76 has a guide rail 20 disposed in the passage area 64 along the line L of travel of the carrier 77. As shown in FIG. 4, the flat guide rail 20 has opposite side edge portions 80 and 82, each tapering sidewards. In other words, each of the side edge portions 80 and 82 has a pair of guide surfaces 84 and 86 sloping relative to a horizontal plane. In order to guide the carrier 77, the guide surfaces 84 and 86 of the right side edge portion 80 are in engagement respectively with the wheels 36 and 38 of the carrier body 28, and the guide surfaces 84 and 86 of the left side edge portion 82 are in engagement respectively with the wheels 40 and 42 of the carrier body 28. Reference numeral 88 designates a conductive body attached to the inner face of the carrier body 28 in such a manner that it confronts the magnet plates 90 attached to the side faces of the support bases 22. The conductive body 88 and the magnet plates 90 constitute a mechanism for braking the carrier 77. Also, reference numeral 92 designates a pair of bumpers projecting from the opposite ends of the carrier body 28 (see FIG. 5). When the carrier 77 collides with any obstacle, these bumpers 92 dampen any impact force due to the collision.

Figure 5:
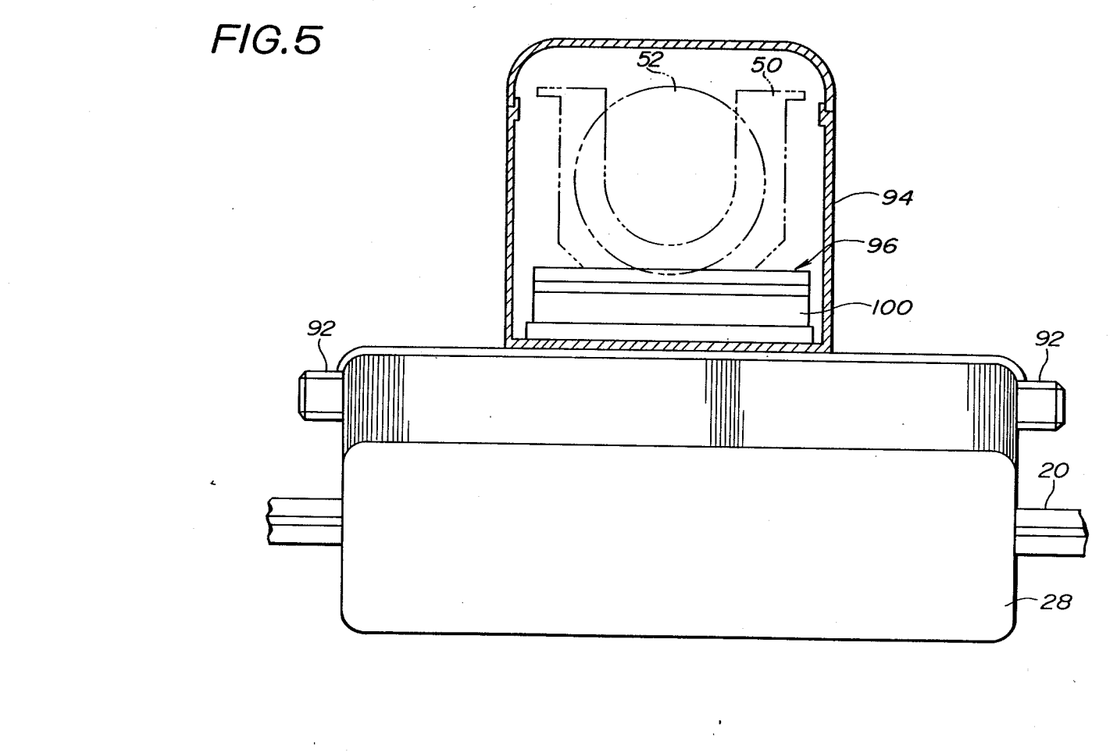
FIG. 5 is a fragmentary side-elevational view, partly in section, of the railway carrier apparatus in FIG. 3.

Referring to FIGS. 4 and 5, the container 94 of this embodiment has a sloping bedplate 96 mounted on the upper face of the bottom wall 98 of the container 94. This bedplate 96 has right and left support legs 100 and 102 positioned respectively at the opposite side portions of the bottom wall 98 of the container 94. The bedplate 96 also has a rectangular and flat plate body 104 extending between the top ends of the support legs 100 and 102. The height of the right side leg 100 is greater than the height of the left side leg 102, that is, the upper face 105 of the plate body 104 is inclined at a predetermined angle $\alpha$ with respect to a horizontal plane in such a manner that the right side edge 103 of the plate body 104 is positioned at a higher level than the left side edge 107 of the plate body 104. The angle $\alpha$ is more than 0° and not more than 40°, and preferably around 20°. An engaging member 106 having an L-shaped cross section is attached to that portion of the plate body 104 adjacent to the left side edge 107 of the plate body 104 for engagement with a wafer cassette 50 to be placed on the bedplate 96.

Figure 6:
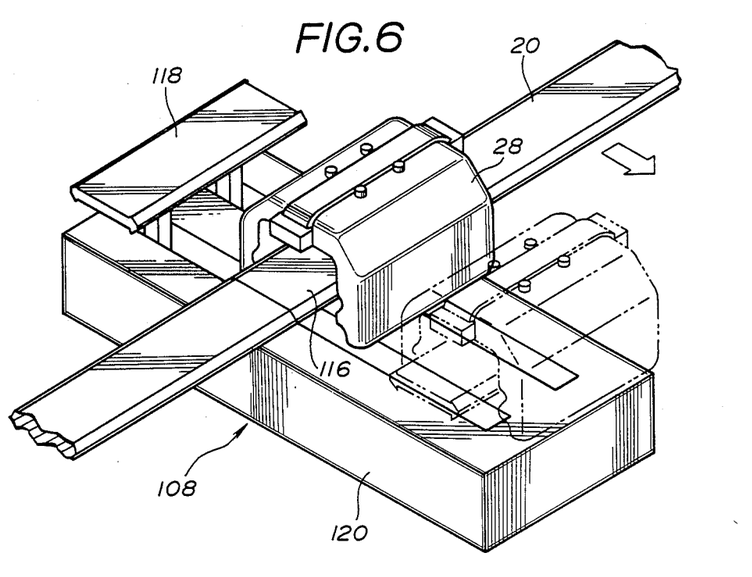
FIG. 6 is a fragmentary perspective view of a station assembly of the railway carrier apparatus in FIG. 3.
Figure 7:
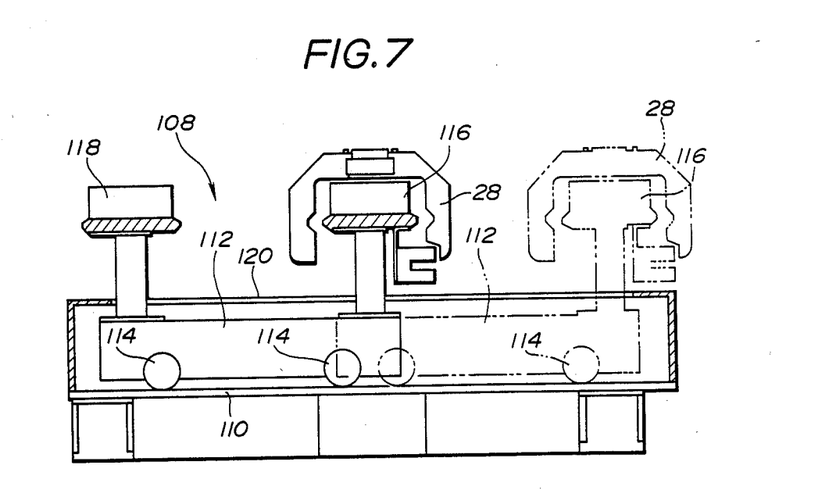
FIG. 7 is a front view, partly in section, of the station assembly in FIG. 3.

Returning to FIG. 3, the guide rail 20 has an incontinuous section 176 in front of the gateway 78. At this incontinuous section, the railway carrier apparatus 76 is provided with a station assembly 108 for transferring a wafer cassette 50 between the railway carrier 76 and the robot 70. As shown in FIGS. 6 and 7, this station assembly 108 includes a track 110 disposed at a level lower than the guide rail 20. As shown in FIG. 3, this track 110 is perpendicular to the guide rail 20 and extends into the work area 62 through the gateway 78. A shifting tray 112 having a plurality of wheels 114 is slidably placed on the track 110 for movement along the track 110. Suitable means such as a linear motor (not shown) interposed between the shifting tray 112 and the track 110 is provided for moving the tray along the track 110. A pair of spaced parallel guide rail pieces 116 and 118 parallel to the guide rail 20 are mounted on and carried by the shifting tray 112. Reference numeral 120 in FIG. 6 denotes a cover enclosing the shifting tray 112. When the tray 112 is in its initial position, i.e., a position shown by the solid line in FIG. 7, the guide rail piece 116 bridges the incontinuous section 176 of the guide rail 20. On the other hand, when the tray 112 is moved into its foremost position, i.e., a position shown by the phantom line in FIG. 7, the guide rail piece 116 is shifted into the work area 62 and the guide rail piece 118 bridges the incontinuous section 176 of the guide rail 20 instead of the guide rail piece 116. That is to say, the guide rail piece 118 allows carriers 77 to pass by the incontinuous section of the guide rail 20 when the guide rail 116 is shifted into the work area 62.

In order to transport semiconductor wafers by the railway carrier apparatus 76, the semiconductor wafers 52 are put into the cassette 50 in such a manner that semiconductor wafers 52 are received in the grooves 51 of the cassette 50 with the front surface of a wafer 52 facing the rear surface of the adjoining wafer 52. Then, as shown in FIG. 4, the cassette 50 is placed on the bedplate 96 of the container 94 so that the cassette-encased semiconductor wafers 52 are inclined to a vertical plane and thereby the rear surfaces of all the wafers 52 lean against the inner walls of the grooves 51 of the cassette. Upon the placement of the wafer cassette 50, an edge portion of the wafer cassette 50 adjacent to its bottom is engaged with the engaging member 106, preventing the wafer cassette 50 from slipping down the upper face 105 of the plate body 104. Thereafter, the carrier 77 is driven along the guide rail 20. When the wafer cassette 50 is in the container 94, the rear surfaces of the wafers 52 lean against the inner wall of the grooves 51 of the wafer cassette 50, in other words, the wafers 52 are stably settled in the cassette 50 and the front faces of the wafers 52 are spaced from the inner wall of the grooves 51. Therefore, the front faces of the semiconductor wafers 52 are not damaged by being rubbed against the inner faces of the grooves 51 even though the carrier 77 is vibrated during the transference of the carrier.

If the wafer cassette 50 should be transported into the work area 62, the carrier 77 is stopped on the guide rail piece 116. Then, the shifting tray 112 is moved forward so that wafer cassette 50 on the guide rail piece 116 is shifted into the work area 62 through the gateway 78. After that, the cassette 50 may be brought into the storage cabinet 66 by the robot 70 to be stored in it temporarily, or it may be transported by the robots 70 and 72 to the processing apparatus 68 via the turntable apparatus 74 to have its containing semiconductor wafers 52 processed. Also, a wafer cassette 50 which contains semiconductor wafers having been processed by the processing apparatus 68 may be transported in the opposite route to the above-described route, and be loaded onto the carrier 77 on the guide rail piece 116. The shifting tray 112 is, then, moved back to its initial position and the carrier 77 is driven again to transport the wafers 52.

During the transference of wafer cassettes 50 within the work area 62, the cassettes 50 may also be kept inclined to the horizontal plane in the same manner as it is in the container 94. The triangles shown in FIG. 3 indicate these inclinations of the wafer cassettes 50. More specifically, the apex of a triangle designates the higher side of the cassette 50.

Figure 8:
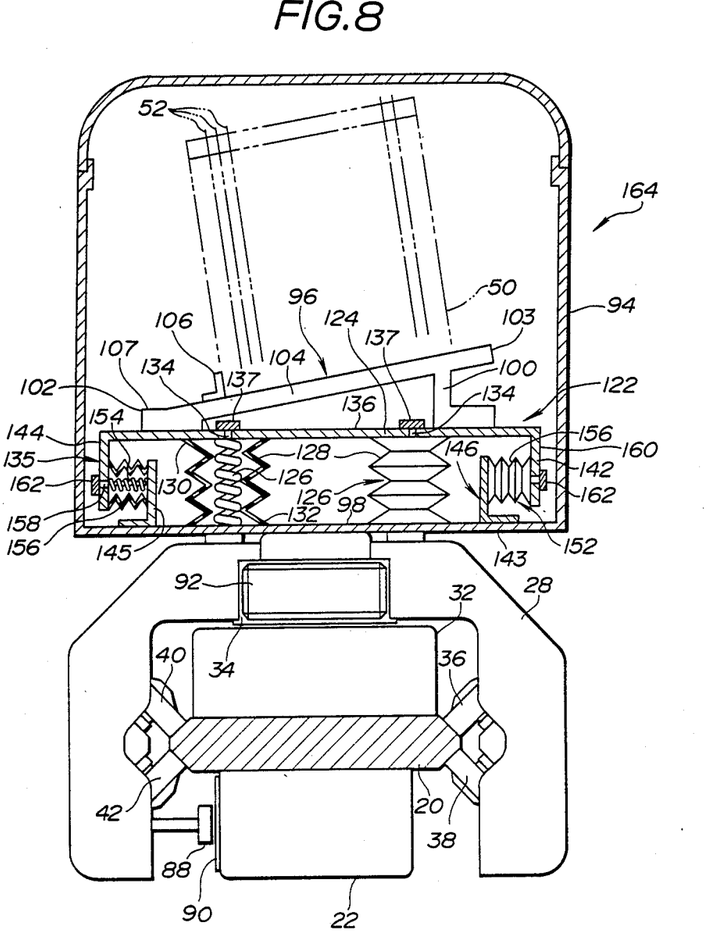
FIG. 8 is a front view, partly in section, of another embodiment of the present invention.
Figure 9:
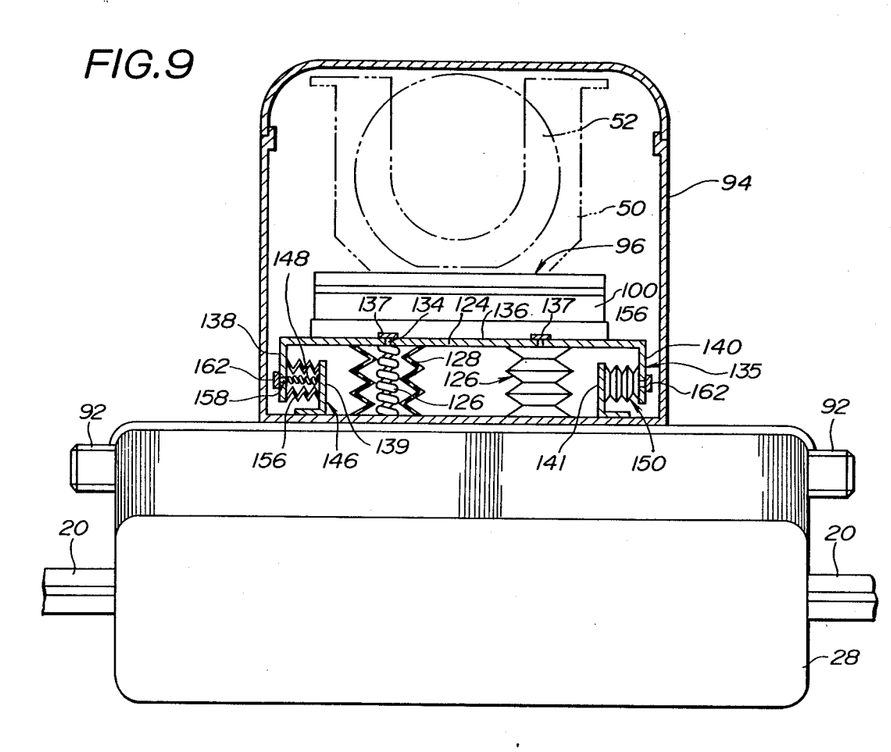
FIG. 9 is a fragmentary side-elevational view, partly in section, of the railway carrier apparatus in FIG. 8.

Another embodiment of the present invention is illustrated in FIGS. 8 and 9, in which a suspension mechanism 122 is interposed between the bedplate 96 and the bottom wall 98 of the container 94. The suspension mechanism 122 includes a plurality of vertical damper members such as upright coil springs 126 bearing a rectangular support plate 124 on which the bedplate 96 is mounted. Each of the coil springs 126 is hermetically and coaxially encased in a tubular bellows 128, the opposite ends 130 and 132 of which are directly attached respectively to the support plate 124 and the bottom wall 98 of the container 94. These tubular bellows 128 are made of resilient material such as natural rubber and synthetic resin and thus are vertically extensible and contractible. The support plate 124 is provided with air vent holes 134, each being in communication with the inside of a tubular bellows 128 and opening to the upper face 136 of the support plate 124. Each vent hole 134 has an inner diameter such that when the bellows 128 extends and contracts, air goes in and out of the corresponding tubular bellows 128 through the vent hole 134 at a predetermined suitable flow rate. The opening of each vent hole 134 is covered by an air filter such as HEPA filter 137. This air filter 137 contains many glass fibers having a diameter of from approximately 0.1 um to several um, thereby adsorbing dust and filtrating air which passes out of the corresponding bellows 128 through the vent hole 134.

The support plate 124 is provided along its periphery with a rectangular connecting frame 135 projecting downwards. This connecting frame 135 surrounds a rectangular support frame 146 which projects upward from the bottom wall 98 of the container 94, the support frame 146 surrounding the plurality of vertical damper members 126. As shown in FIG. 9, a plurality of front damper members such as horizontal coil springs 148 are interposed between the front portion 138 of the connecting frame 135 and the front portion 139 of the support frame 146. A plurality of rear damper members such as horizontal coil springs 150 extend between the rear portion 140 of the connecting frame 135 and rear portion 141 of the support frame 146. Furthermore, as shown in FIG. 8, a plurality of side damper members such as horizontal coil springs 152 and 154 are interposed respectively between the side portion 142 of the connecting frame 135 and the side portions 143 of the support frame 146, and between the side portion 144 of the connecting frame 135 and the side portion 145 of the support frame 146. Each of these horizontal coil springs 148, 150, 152 and 154 is coaxially encased in a tubular bellows 156 in the same manner as the upright coil springs 126. The connecting frame 135 is provided with air vent holes 158, each being in communication with the inside of a tubular bellows 156 and opening to the outer face 160 of the connecting frame 135. Each vent hole 158 also has an inner diameter such that when the bellows 156 extends and contracts, air goes in and out of the corresponding tubular bellows 156 through the vent hole 158 at a predetermined suitable flow rate. The opening of each vent hole 158 is also covered by an HEPA filter 162 in the same manner as the air vent hole 134 of the support plate 124.

When the carrier 164 of this embodiment is vibrated back and forth for example upon its starting or its braking, the front and rear damper members 148 and 150 dampen the vibration, thereby preventing the vibration from being transferred to the wafer cassette 50 on the bedplate 96. When the carrier 164 is vibrated from side to side upon its cornering, the side damper members 152 and 154 dampen the vibration, whereby the wafer cassette 50 is subjected to less vibration than the carrier 164. When the carrier 164 is vertically vibrated for example, due to the seam of the guide rail 20, the vertical damper members 126 dampen the vibration, thereby hindering the cassette 50 on the bedplate 96 from pitching. Consequently, the semiconductor wafers 52 in the wafer cassette 50 are not damaged from being rocked even though the carrier 164 is vibrated during its transference.

Figure 10:
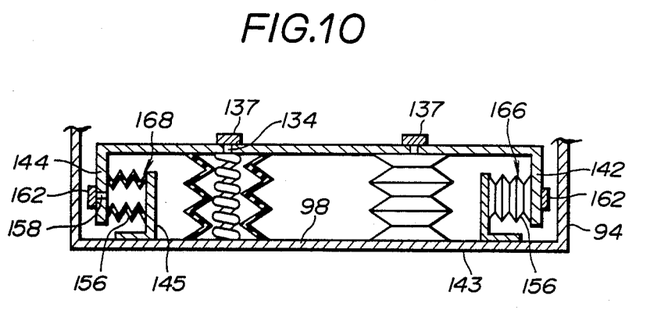
FIG. 10 is a front view, partly in section, of a modified form of a suspension mechanism in FIG. 8.

A modified form of the suspension mechanism in FIG. 8 is illustrated in FIG. 10, in which each of side damper members 166 and 168 comprises a tubular bellows 156 without a coil spring within it. The diameter of each of the air vent holes 158 is adjusted to a size such that each of the tubular bellows 156 works the same as a spring.

Figure 11:
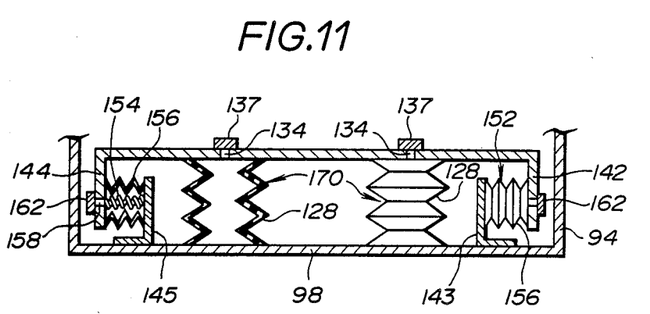
FIG. 11 is a front view, partly in section, of another modified form of the suspension mechanism in FIG. 8.

FIG. 11 shows another modified form of the suspension mechanism in FIG. 8, in which each of vertical damper members 170 comprises a tubular bellows 128 having no coil spring within it.

Figure 12:
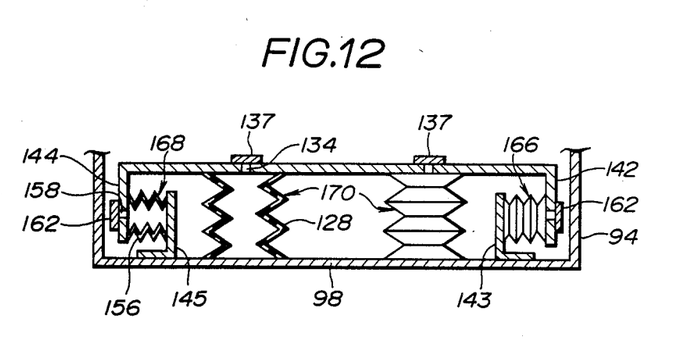
FIG. 12 is a front view, partly in section, of a further modified form of the suspension mechanism in FIG. 8.

FIG. 12 illustrates a further modified form of the suspension mechanism in FIG. 8. Each of all the damper members 166, 168 and 170 of this suspension mechanism, comprises a tubular bellows 128 or 156.

Figure 13:
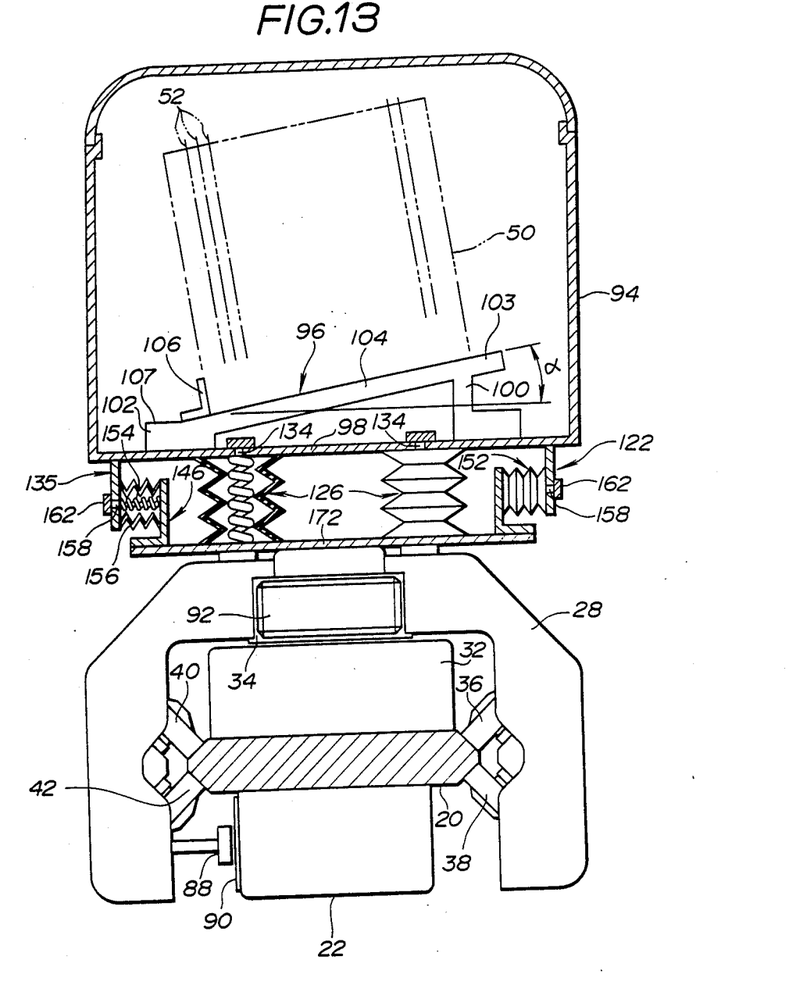
FIG. 13 is a front view, partly in section of a modified form of a carrier in FIG. 8.

Although, in the foregoing embodiment and in the modified forms, the suspension mechanism 122 is interposed between the bedplate 96 and the bottom wall 98 of the container 94, the suspension mechanism 122 may be interposed between the carrier body 28 and the container 94 as shown in FIG. 13 which illustrates a modified form of the carrier in FIG. 4. In such a case, the vertical damper members 126 and the support frame 146 may be secured via a mount plate 172 to the carrier body 28. Also in this case, the connecting frame 135 is provided on the lower face of the bottom wall 98 of the container 94, and the air vent holes 134 are formed in the bottom wall 98 of the container.

What is claimed is:

1. A railway carrier apparatus for transporting semiconductor wafers contained in a wafer cassette, each said wafer having front and rear sides, said wafer cassette having an open top, a bottom wall, first and second opposite side walls and internal walls, said first and second side walls extending from said bottom wall to said open top, said internal walls defining, respectively, a plurality of parallel grooves intermediate said first and second side walls for receiving said wafers in parallel aligned relationship along an axis extending between said first and second side walls and substantially perpendicular to said bottom wall, the front sides of the wafers facing said first side wall, the railway carrier apparatus including: a carrier for carrying the wafer cassette; a guide rail, disposed along a line of travel of the carrier, for supporting the carrier to guide the carrier along the line of travel; and drive means for driving the carrier along the line of travel, said carrier comprising;

a carrier body slidably connected to the guide rail for movement along the guide rail; and means for preventing damage to the front sides of said wafers comprising a bedplate member mounted on the carrier body for supporting the wafer cassette on an upper face of said bedplate member such that the bottom wall of said cassette rests on said upper face with the wafers in said cassette being oriented in parallel with the line of travel of said carrier, the upper face of the bedplate member having one and the other side edges arranged to extend in a direction parallel to the line of travel, said one and the other side edges being disposed adjacent to, respectively, said first and second side walls of said cassette, the upper face being inclined with respect to a horizontal plane in such a manner that said one side edge is positioned at a higher level than the other side edge whereby the rear side of each said wafer in the cassette on said bedplate member leans against an adjacent internal wall of said cassette and the front side of each said wafer is spaced from the adjacent internal wall of said cassette.

2. A railway carrier apparatus according to claim 1, wherein the upper face of the bedplate member is inclined at an angle larger than 0° and not larger than 40°.

3. A railway carrier apparatus for transporting semiconductor wafers contained in a wafer cassette, each said wafer having front and rear sides, said wafer cassette having an open top, a bottom wall, first and second opposite side walls and internal walls, said first and second side walls extending from said bottom wall to said open top, said internal walls defining, respectively, a plurality of parallel grooves intermediate said first and second side walls for receiving said wafers in parallel aligned relationship along an axis extending between said first and second side walls and substantially perpendicular to said bottom wall, the front sides of the wafers facing said first side wall, the railway carrier apparatus including: a carrier for carrying the wafer cassette; a guide rail, disposed along a line of travel of the carrier, for supporting the carrier to guide the carrier along the line of travel; and drive means for driving the carrier along the line of travel, said carrier comprising:

a carrier body slidably connected to the guide rail for movement along the guide rail;

means for preventing damage to the front sides of said wafers comprising a bedplate member, having an upper face and mounted on the carrier body for supporting the wafer cassette on an upper face of said bedplate member such that the bottom wall of said cassette rests on said upper face with the wafers in said cassette being oriented in parallel with the line of travel of said carrier, the upper face of the bedplate member having one and the other side edges arranged to extend in a direction parallel to the line of travel, said one and the other side edges being disposed adjacent, respectively, to the first and second side walls of the cassette, the upper face being inclined at an angle larger than 0° and not larger than 40° with respect to a horizontal plane in such a manner that said one side edge is positioned at a higher level than the other side edge whereby the rear side of each said wafer in the cassette on said bedplate member leans against an adjacent internal wall of said cassette and the front side of each said wafer is spaced from the adjacent internal wall of said cassette;

and the carrier further including an engaging member, attached to that portion of the bedplate member adjacent to the other side edge of the upper face of the bedplate member, for engaging with the wafer cassette so that the cassette is prevented from slipping down the upper face of the bedplate member.

4. A railway carrier apparatus according to claim 3, wherein the carrier further comprises suspension means, interposed between the carrier body and the bedplate member, for dampening the vibration transferred from the carrier body to the bedplate member so that the semiconductor wafers in the wafer cassette on the bedplate are subjected to less vibration than the carrier body.

5. A railway carrier apparatus according to claim 4, wherein the suspension means comprises a plurality of vertical damper members, each being vertically elastic.

6. A railway carrier apparatus according to claim 1, wherein each of the vertical damper members comprises a first tubular bellows made of resilient material.

7. A railway carrier apparatus according to claim 6, wherein each of the vertical damper members further comprises a coil spring coaxially encased in the first tubular bellows.

8. A railway carrier apparatus according to claim 6 or 7, wherein the suspension means further comprises: first air vent means for allowing air to go in and out of the first tubular bellows; and first filter means for filtrating air going out of the first tubular bellows through the first air vent means.

9. A railway carrier apparatus according to claim 8, wherein the suspension means further comprises: a support frame member fixedly connected to the carrier body and projecting upward; a connecting frame member fixedly connected to the bedplate member and projecting downward so as to confront with the support frame member; and a plurality of horizontal damper members extending between the support and connecting frame members, each of the horizontal damper members being horizontally elastic.

10. A railway carrier apparatus according to claim 9, wherein each of the horizontal damper members comprises a second tubular bellows made of resilient material.

11. A railway carrier apparatus according to claim 10 or 7, wherein each of the horizontal damper members further comprises a coil spring coaxially encased in the second tubular bellows.

12. A railway carrier apparatus according to claim 10, wherein the suspension means further comprises: second air vent means for allowing air to go in and out of the second tubular bellows; and second filter means for filtrating air going out of the second tubular bellows through the second air vent means.

13. A railway carrier apparatus according to claim 11, wherein the suspension means further comprises: second air vent means for allowing air to go in and out of the second tubular bellows; and second filter means for filtrating air going out of the second tubular bellows through the second air vent means.

14. A railway carrier apparatus for transporting semiconductor wafers contained in a wafer cassette, the railway carrier apparatus including: a carrier for carrying the wafer cassette; a guide rail, disposed along a line of travel of the carrier, for supporting the carrier to guide the carrier along the line of travel; and drive means for driving the carrier along the line of travel, said carrier comprising;
- a carrier body slidably connected to the guide rail for movement along the guide rail;
- a bedplate member, having an upper face and mounted on the carrier body, for supporting the wafer cassette on the upper face thereof, the upper face of the bedplate member having one and the other side edges, the upper face being inclined with respect to a horizontal plane in such a manner that said one side edge is positioned at a higher level than the other side edge;
- and a station assembly for shifting the carrier in a horizontal direction perpendicular to the line of travel.

15. A railway carrier apparatus according to claim 14, wherein the guide rail has an incontinuous section, and the station assembly comprises: a track disposed under the incontinuous section of the guide rail and extending perpendicular to the guide rail; a shifting tray member slidably connected to the track for movement along the track; and a guide rail piece carried by the shifting tray member, the guide rail piece bridging the incontinuous section of the guide rail when the shifting tray member is in its initial position.

* * * * *